United States Patent [19]

Griffin

[11] 4,001,610
[45] Jan. 4, 1977

[54] TIME DELAY CIRCUIT

[75] Inventor: Floyd S. Griffin, Fort Walton Beach, Fla.

[73] Assignee: Ordnance Research, Inc., Fort Walton Beach, Fla.

[22] Filed: June 30, 1975

[21] Appl. No.: 592,025

[52] U.S. Cl. .............................. 307/293; 307/246; 307/251; 320/1; 102/70.2 R
[51] Int. Cl.$^2$ ................ H03K 17/26; H03K 17/56; H03K 5/13
[58] Field of Search .................. 307/246, 251, 293; 320/1; 102/70.2 R

[56] References Cited

UNITED STATES PATENTS

| | | | |
|---|---|---|---|
| 3,700,968 | 10/1972 | Spies | 307/246 |
| 3,732,823 | 5/1973 | Held et al. | 102/70.2 R |
| 3,787,740 | 1/1974 | Salton et al. | 307/293 |
| 3,862,441 | 1/1975 | Nabetani et al. | 307/293 |

OTHER PUBLICATIONS

"Negative Resistance Circuit Using Two Complementary Field Effect Transistors" in Proceedings of the IEEE, vol. 53, No. 4, Apr. 1965 – p. 404.

Primary Examiner—Stanley D. Miller, Jr.
Attorney, Agent, or Firm—Kemon, Palmer & Estabrook

[57] ABSTRACT

An electric timing circuit for the time delayed delivery of a voltage pulse to an electric fuze element or other current or voltage sensitive element uses a capacitor voltage source which can be charged from an external source of electric potential. The capacitor discharges through the leakage resistance of its dielectric and through leakage resistance of semiconductor devices in the biased "off" state, until the capacitor voltage decreases to a preset value, at which time a threshold value switch connects the electric element to the capacitor voltage source. The threshold value switch is constituted by two series connected Field Effect Transistors, one N channel type and one P channel type. Both transistors are biased in the "off" condition by the circuit connections until the capacitor voltage decreases to the threshold level and turns both transistors "on". The two non-conducting transistor channels in series permit a very long discharge time for a given capacitor. One embodiment of the invention utilizes the negligible current threshold switch in series with the gate circuit of a thyristor to trigger the thyristor and permit a large current flow through the thyristor and the series connected electric element. A second embodiment of the invention uses the two-transistor threshold switch in series with a sensitive electric element.

7 Claims, 3 Drawing Figures

TIME DELAY CIRCUIT

FIELD OF THE INVENTION

This invention relates to electric timing circuits and, more particularly, to a new and improved electric timing circuit which does not require current from an energy storage timing capacitor and provides extremely long delay times limited primarily by the inherent leakage current within the dielectric of the capacitor itself, and provides time delayed delivery of a firing pulse from a capacitor, charged from an external voltage source, to an electric element, for example, an electric fuze element, when the capacitor voltage falls below a preset value.

BACKGROUND OF THE INVENTION

Prior electric timing circuits of this type have been limited in maximum delay time available from a small energy storage timing capacitor due to a requirement of prior circuits that some current be drawn from the storage/timing capacitor for proper operation of the circuit, thereby discharging the capacitor within a few minutes or a few hours.

Such prior circuits generally require an additional timing capacitor to be charged through a resistor from the energy storage capacitor, or other voltage source, from zero volts up to the threshold voltage of an auxiliary switching device which may be, for example, a four layer diode, a glow lamp, a spark gap, or a zener diode connected in series with a thyristor gate electrode, which conducts as the voltage rises to the threshold level of the particular switching device and connects the remaining voltage of the energy storage capacitor to an electric fuze element.

Other prior circuits utilize a small current from the storage capacitor through a limiting resistor in series with a small coulometer device which electrolytically plates a limited quantity of metal from one electrode to the other until the available electrode metal is depleted, constituting the end of the timing cycle, at which time the electrical resistance of the coulometer device increases resulting in an increased voltage across the device which is used to trigger a thyristor or transistor, connecting the remaining energy storage capacitor voltage to an electric detonator.

The prior circuits which utilize an additional timing capacitor or auxiliary timing device not only require current from the storage capacitor with resulting limits on maximum delay time, but also have the disadvantage that extraordinary or unforeseen leakage currents, particularly under high ambient temperature conditions, may discharge the energy storage capacitor prior to the end of the timing cycle, as determined by the auxiliary timing components, and result in a dud, or unexploded shell, bomb, or mine with possible subsequent danger to friendly personnel.

Other timing circuits, for example U.S. Pat. No. 3,700,968, utilize a decreasing-voltage threshold detector to connect the remaining voltage on the energy storage capacitor, when the capacitor voltage decreases to the threshold value, to the electric fuze element without suffering the disadvantage of a possible dud; however, that circuit requires current from the capacitor in order to maintain the threshold switch in the non-conducting state until the voltage threshold is reached, and consequently reduces the maximum delay time. That circuit also requires a relatively expensive current limiting resistor in the order of 1000 megohms or higher for its maximum delay time.

SUMMARY OF THE INVENTION

The objective of the invention is to provide an electric timing circuit without a charge-transferring capacitor or other auxiliary timing device or without requiring a deliberate current drain from an energy storage capacitor, and whose delay time can be varied up to extremely high values by the simple expedient of selecting external charging source voltages, and which delivers a time delayed voltage pulse suitable for ignition of an electric fuze element even in the case of a possibly premature discharge of a storage capacitor caused by, for example, extraordinary or unforeseen leakage currents.

The invention consists of an electric timing circuit for the time delayed delivery of a voltage pulse to an electric fuze element, having a voltage source which is a capacitor or small electric battery discharging only through its internal leakage resistance and inherent circuit leakage resistance for maximum time delay, and having a decreasing-voltage threshold value switch connecting the fuze element with the voltage source when the voltage of the voltage source falls below a predetermined value. In accordance with the invention, the decreasing-voltage threshold value switch consists of an N channel field effect transistor and a P channel field effect transistor with their channels connected in series between the voltage source and the load with both transistors biased in the non-conducting state until the voltage of the voltage source decreases to a predetermined threshold value. The source electrodes of the two transistors are connected together, the drain electrode of the N channel transistor is connected to the positive terminal of the voltage source, and the drain electrode of the P channel transistor is connected to the negative terminal of the voltage source through an electric detonator and/or the gate-cathode circuit of a thyristor. The gate electrode of the N channel transistor is connected to the drain electrode of the P channel transistor and the gate electrode of the P channel transistor is connected to the drain electrode of the N channel transistor. The above gate connections insure that the respective transistors will be biased in their non-conducting condition as long as the source voltage is greater than the sum of the respective cut-off bias voltage, $V_p$ ("Pinch Off Voltage") of the two transistors. The common source electrode connection of the two transistors will have a voltage potential between zero and the voltage on the voltage source and the gate electrode of the N channel transistor will be at a negative voltage with respect to the voltage on the source electrode of the N channel transistor which will, when greater than the $V_p$ of the N channel device, bias the N channel transistor to its cut-off state. Likewise the gate electrode voltage of the P channel transistor will be positive with respect to the voltage on the source electrode of the P channel transistor and will cause the P channel transistor to also be in its non-conducting state when its drain to source voltage is greater than the $V_p$ of that device.

Since the leakage resistance of a field effect transistor in its cut-off state is very high, in the order of 1000 megohms, and this circuit uses two biased - "off" field effect transistors in series, its discharge effect on an energy storage capacitor will be insignificant as compared to the internal leakage resistance of some capacitors, particularly electrolytic capacitors. Both field effect transistors will remain in their cut-off state as long as the voltage of the voltage source is greater than the sum of their respective cut-off gate bias voltages which is the threshold firing voltage of the circuit. As the voltage of the voltage source decreases toward the threshold voltage, one of the transistors, having the lower $V_p$, will tend to turn on and decrease its channel resistance which tends to cause the voltage potential of the common source electrode junction of the two transistors to change in the direction of the voltage potential on the drain of the transistor which first starts to turn on, similar to the action of the center tap on a resistive voltage divider when the value of one of the resistors is decreased. As the channel voltage across one of the transistors is thus decreased, the cut-off bias of the gate electrode of the other transistor is decreased which tends to turn on the second transistor and results in a regenerative switching action when the voltage of the voltage source decreases to the threshold value, and applies the remaining voltage on the voltage source to an electric fuze element.

The switch action of the two interconnected transistors which initiates the ignition of the electric fuze element therefore is determined, in accordance with this invention, only by a decrease of the voltage of the voltage source below a predetermined threshold value which for practical purposes is approximately the sum of the cut-off bias voltages of the two transistors used.

In the event of extraordinary and unforeseen circuit leakage within or external to the voltage source, the remaining voltage on the voltage source will be connected to the electric fuze element, however, earlier than the anticipated delay time, at the instant that the threshold voltage is reached by the voltage source. An artillery shell, or bomb, or rocket, or mine equipped with a delay fuze circuit in accordance with this invention therefore cannot become a dud and cannot subsequently present a hazard to friendly personnel.

In accordance with the preferred embodiment of the invention, the electric timing circuit is characterized in that the output of the switch, formed by the two series connected field effect transistors, is used to trigger the control or gate electrode of a controllable electric valve, such as a thyristor or transistor, which is connected in series with the voltage source and the electric fuze element. This arrangement permits the entire residual voltage on the voltage source, identical to the threshold voltage of the field effect transistor switch circuit, to be applied to the electric fuze element for its initiation.

An object of the invention is to provide an improved electric timing circuit for the time-delayed delivery of a suitable voltage pulse to an electric fuze element.

A further object of the invention is to provide such an electric timing circuit including a voltage source which is preferably a capacitor discharging primarily through its own internal leakage resistance.

Another object of the invention is to provide such an electric timing circuit which does not require a charge transfer capacitor or other auxiliary timing device, and whose time delay can be varied within wide limits and up to very high values.

A further object of the invention is to provide such an electric timing circuit whose time delay can be varied over a very wide range by selection of external charging voltage of the energy storage capacitor.

An additional object of the invention is to provide such an electric timing circuit whose time delay can be compensated over a very wide temperature range by variation of external charging voltage of the energy storage capacitor.

Another object of the invention is to provide such an electric timing circuit which delivers a voltage pulse sufficient for ignition of an electric fuze element even in event of a possible premature discharge of an energy storage capacitor caused, for example, by extraordinary and unforeseen leakage currents.

For an understanding of the principles of the invention, reference is made to the following description of typical embodiments thereof as illustrated in the accompanying drawing.

DETAILED DESCRIPTION OF THE DRAWINGS

Figure 1:
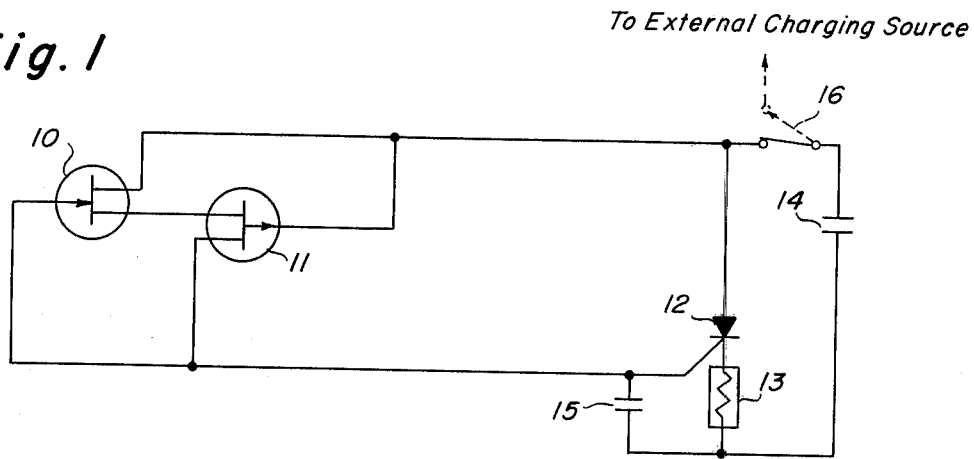
FIG. 1 is a schematic wiring diagram of a preferred embodiment of the invention and providing a time-delayed delivery of a voltage pulse to an electric fuze element.

With reference to FIG. 1, a pair of field effect transistors 10 and 11 are shown with their drain-source paths connected in series. As shown, the transistor 10 is of the N channel junction field effect depletion type and the transistor 11 is of the P channel junction field effect depletion type. A third solid state device in the form of a thyristor 12 has its anode cathode circuit connected in series with an electric fuze element 13. A capacitor 14 serving as a voltage source for the circuit which includes the devices 10, 11, and 12 is preferably connected to the balance of the circuit by means of an isolating switch 16 in order to permit the charging of the capacitor without any connection between the charging source and the balance of the circuit. A further capacitor 15 may be connected between the gate and cathode of the thyristor 12 in order to preclude premature initiation of the electric fuze element in the event that the capacitor 14 is charged with the switch 16 in closed position. The capacitance 15 will also minimize inadvertant triggering of the thyristor 12 from electromagnetic interference.

In operation, the capacitor 14 is charged to a value which is greater than the $V_p$ (pinch-off voltage) of each of the transistors 10 and 11. Thus the charged capacitor 14 has a voltage which is greater than the sum of the pinch-off voltages of the two transistors 10 and 11. Once the charging source is removed from the capacitor 14 and it is connected into the circuit by closure of the switch 16, the voltage of the capacitor will begin to decrease by the discharge current through the internal leakage resistance of the capacitor, the inherent leakage resistance of the semi-conductor devices and the surface leakage resistance of the insulating substrate on which the components are preferably mounted. As the voltage of capacitor 14 continues to decrease due to the discharge process through the above mentioned resistances, it eventually will approach the threshold value of the switch circuit comprised of transistors 10 and 11. One of the transistors, that is the one having the lower pinch-off voltage will begin to conduct first and decrease its channel resistance which is in series with the other non-conducting transistor channel. For example, if transistor 10 begins conducting first, the voltage of the common source electro-junction of the two transistors will increase in the direction of the voltage on the voltage source capacitor 14 and reduce the gate-to-source bias voltage of transistor 11 tending to cause transitor 11 also to conduct. This in turn reduces the gate-to-source bias voltage of transistor 10 to cause it to conduct a greater amount of current, resulting in a regenerative switching action of the two series transistors at a threshold voltage determined by the pinch-off voltage of the two respective transistors. When both transistors become conducting, sufficient current flows through the two series connected transistors from the capacitor 14 into the gate electrode of thyristor 12 to switch the thyristor to its conducting state and this connects the remaining voltage on the capacitor 14 to the fuze element 13 causing it to detonate an explosive charge not shown.

Since components, including capacitors, thyristors, and field effect transistors, are available with leakage currents in the low nanoampere range, this invention provides the possibility of obtaining time delays of several hundred hours with a small capacitor.

However, if the leakage currents within the electric circuits shown in FIG. 1 or in capacitor 14 should be greater than expected, the switching effect, initiated by transistors 10 and 11, simply occurs at an earlier time than that calculated, as this switching effect depends only on the voltage value of capacitor 14 and is not affected by the discharge time response.

In the circuit shown in FIG. 1, electric fuze element 13 is initiated by an electric current only when thyristor 12 is triggered into conduction by a voltage pulse released by the two transistors 10 and 11.

Figure 2:
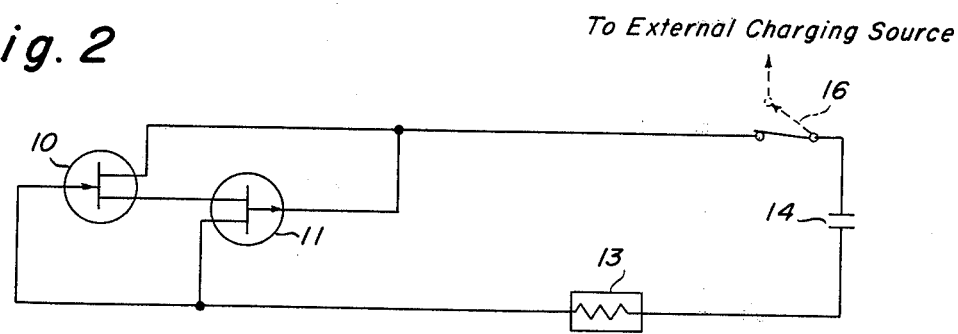
FIG. 2 is a schematic wiring diagram of a second embodiment of the invention, used to initiate a sensitive electric fuze element directly with the field effect transistor voltage threshold switch.

FIG. 2 illustrates a second embodiment of the invention in which the thyristor is omitted and the voltage pulse released by transistors 10 and 11 is transmitted directly to a sensitive electric fuze element 13. The operation of the timing circuit shown in FIG. 2 is identical to that described above and like reference characters have been used for like components in FIGS. 1, 2, and 3.

Figure 3:
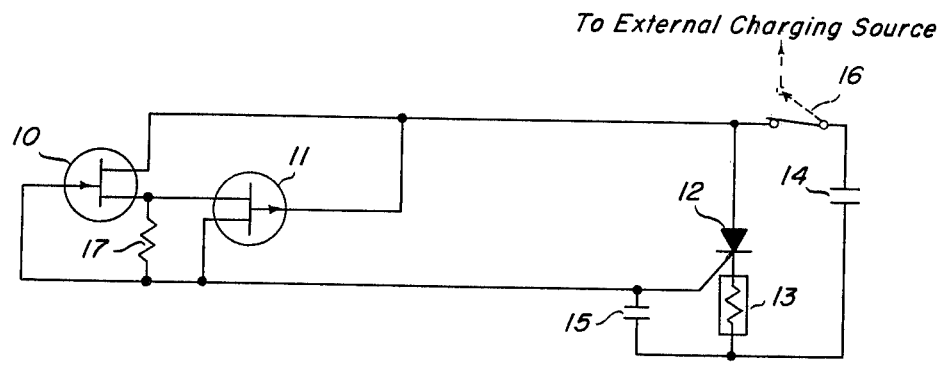
FIG. 3 is a schematic wiring diagram of a third embodiment of the invention.

FIG. 3 illustrates another embodiment of the invention and is similar in operation to the circuit shown in FIG. 1 except that resistor 17 is added to the circuit connected in series between the source electrode of transistor 10 and the drain electrode of transistor 11 to illustrate a means of obtaining increased flexibility in selecting the delay time of the circuit by providing an additional constant current path for discharge of capacitor 14 thus increasing the linearity of the capacitor 14 voltage-versus-time discharge curve. Current through resistor 17 is nearly constant since transistor 10 will only permit enough current through resistor 17 to establish an equilibrium bias voltage at its gate electrode to maintain that same current. If that current tended to increase, the voltage across resistor 17 would also tend to increase and thus increase the negative gate-to-source electrode bias voltage which would tend to reduce the current to the original value. Likewise, a decrease in current would reduce the negative bias voltage and allow current to increase to the original value determined only by the value of resistor 17 and the gate bias voltage characteristic of transistor 10 with minimum change due to the decreasing voltage of capacitor 14. It follows that the voltage developed across a fixed value resistor 17 will be a constant voltage; however, if 17 is made variable it may be used to adjust delay time of the circuit. Delay time may also be adjusted to a smaller value by adding a resistor across the terminals of capacitor 14.

Although the circuits have been described as including N channel and P channel depletion type junction field effect transistors, it is of course possible, within the scope of the invention, to use N channel and P channel depletion type insulated gate field effect transistors.

The electric timing circuit shown in FIGS. 1 and 2 has the advantage that the delay time can be adjusted over a very wide range merely by varying the ultimate value of the voltage to which the capacitor 14 is charged and which is limited only by the respective breakdown voltages of the components included in the timing circuit.

Delay time of the electric timing circuit shown in FIGS. 1, 2 and 3 can be compensated for accuracy over a very wide temperature range merely by varying the charging voltage, as for example with a thermistor/resistor voltage divider.

While specific embodiments of the invention have been shown and described in detail to illustrate the application of the principles of the invention, it will be understood that the invention may be embodied otherwise without departing from such principles and applicant therefor claims a full range of equivalents within the scope of the appended claims.

I claim:

1. An electric timing circuit comprising in combination:
    a threshold value switch including an N-channel F.E.T. and a P-channel F.E.T. having their drain-source path connected in series, the gate electrodes of each connected to the drain of the other and their source electrodes connected together;
    a voltage sensitive element;
    a self contained voltage source; and
    means connecting said source, said element and the drain-source path of said F.E.T.s in a series circuit.

2. An electric timing circuit, as claimed in claim 1, said voltage source being a capacitor.

3. An electric timing circuit, as claimed in claim 1, including means connected in said timing circuit providing a constant current discharge of said voltage source.

4. An electric timing circuit, as claimed in claim 2, including an electric valve connected in series with said voltage sensitive element and having a control electrode; said threshold value switch being connected to said control electrode.

5. An electric timing circuit, as claimed in claim 4, said electric valve being a thyristor.

6. An electric timing circuit, as claimed in claim 4, including a pair of terminals for connection to an external source of electric potential; said capacitor being connected across said terminals; and a second capacitor connected between said control electrode of said electric valve and one end of said element.

7. An electric timing circuit, as claimed in claim 4 including a mechanical switch to permit charging said capacitor from an external charging voltage source and subsequently disconnecting said capacitor from said external charging voltage source and connecting said capacitor to said threshold value switch.

* * * * *